(12) United States Patent
Colinge et al.

(10) Patent No.: US 6,391,752 B1
(45) Date of Patent: May 21, 2002

(54) METHOD OF FABRICATING A SILICON-ON-INSULATOR SEMICONDUCTOR DEVICE WITH AN IMPLANTED GROUND PLANE

(75) Inventors: Jean Pierre Colinge, Carmichael; Carlos H. Diaz, Mountain View, both of CA (US)

(73) Assignee: Taiwan Semiconductor Manufacturing, Co., Ltd., Hsin-Chu (TW)

( * ) Notice: Subject to any disclaimer, the term of this patent is extended or adjusted under 35 U.S.C. 154(b) by 0 days.

(21) Appl. No.: 09/659,920

(22) Filed: Sep. 12, 2000

(51) Int. Cl.$^7$ .................. H01L 21/3205; H01L 21/4763
(52) U.S. Cl. ...................... 438/585; 438/197; 438/217; 438/230; 438/305; 438/564; 438/589
(58) Field of Search .................................. 438/585, 217, 438/231, 291, 564, 305, 230, 589, 299, 300, 197, 303

(56) References Cited

U.S. PATENT DOCUMENTS

| | | | | |
|---|---|---|---|---|
| 6,124,177 A | * | 9/2000 | Lin et al. | 438/305 |
| 6,232,160 B1 | * | 5/2001 | Shih et al. | 438/197 |
| 6,232,164 B1 | * | 5/2001 | Tsai et al. | 438/127 |

OTHER PUBLICATIONS

D.J. Frank et al., Technical Digest of IEDM, p 553, 1992.
J.P. Denton et al., IEEE Electron Device Letters, 17, p. 509, 1996.
J.P. Colinge et al., Technical Digest of IEDM, p. 595, 1990.

* cited by examiner

*Primary Examiner*—Matthew Smith
*Assistant Examiner*—Igwe U. Anya
(74) *Attorney, Agent, or Firm*—Darby & Darby

(57) ABSTRACT

A method of fabricating a SOI semiconductor device with an implanted ground plane in the silicon substrate to increase the doping concentration underneath the channel region for suppressing short-channel effects (SCEs) such as drain-induced barrier lowering (DIBL). For a N-channel MOSFET, the implanted ground plane is P+ type such that if a P-type underlying substrate is used, the ground plane is automatically connected to ground potential (the substrate potential). For a SOI-type CMOS semiconductor device with two spaced-apart implanted ground planes each self-aligned to be underneath a corresponding channel region of the CMOS, two SOI-type MOSFET semiconductor devices of opposite conductivity types are formed on a same semiconductor substrate. The increase in doping concentration underneath the channel region prevents the electric field lines from the gate from terminating under the channel region; instead, the electric field lines terminate in the ground plane, thereby suppressing the short-channel effects and the off-state leakage current of the MOSFETs.

11 Claims, 5 Drawing Sheets

METHOD OF FABRICATING A SILICON-ON-INSULATOR SEMICONDUCTOR DEVICE WITH AN IMPLANTED GROUND PLANE

BACKGROUND OF THE INVENTION

1. Field of the Invention

The present invention relates generally to silicon-on-insulator (SOI) semiconductor devices; more particularly, the invention relates to a method of fabricating a SOI semiconductor device with an implanted ground plane in the silicon substrate to increase the doping concentration underneath the channel region for suppressing short-channel effects (SCEs) such as drain-induced barrier lowering (DIBL).

2. Description of the Prior Art

Silicon-on-insulator (SOI) technology, which is becoming increasingly important in the field of integrated circuits, relates to the formation of transistors in a layer of semiconductor material which overlies an insulating layer. Fabricating integrated circuit (IC) devices in a thin SOI layer, as opposed to fabricating the same IC devices in a much thicker bulk silicon structure, allows for lower parasitic capacitance and for greater channel currents which, in turn, allows for faster speeds. Furthermore, field effect transistors such as MOSFETs fabricated in the silicon film of an SOI structure have many advantages over MOSFETs fabricated on the traditional bulk silicon substrates including resistance to short-channel effect, steeper subthreshold slopes, increased current drive, higher packing density, reduced parasitic capacitance, and simpler processing steps. In addition, recent advancements in the SOI silicon film quality, buried oxide quality, and manufacturing throughput have opened the door to a multitude of ultra large scale integration (ULSI) applications. Since SOI structures significantly alleviate the parasitic elements and increase the junction breakdown tolerance of the structure, the SOI technology is well-suited for high performance and high density integrated circuits.

MOSFETs fabricated with SOI technology include non-fully depleted MOSFETs with silicon film thickness greater than the maximum channel depletion width and fully-depleted MOSFETs having silicon film thickness less than the maximum channel depletion width. Fully-depleted SOI MOSFETs are known to have a near-ideal subthreshold slope. A slope factor of 1.05, a subthreshold slope of 63 mV/decade is indeed expected, but the presence of a grounded back gate brings it up to values around 66–68 mV/decade. According to the publication "Monte Carlo Simulation of a 30 nm Dual-Gate MOSFET: How Short Can Si go?" by D. J. Frank, S. E. Laux, and N. V. Fischetti, Technical Digest of IEDM, p. 553, 1992, the "ultimate MOSFET" should be a fully-depleted MOSFET with dual (top and bottom) gates. In dual-gate SOI MOSFETs, values very close to the theoretical limit of 60 mV/decade are expected. Furthermore, this low value can be obtained for very short channel lengths provided that the gate oxide thickness and the silicon film thickness are scaled appropriately. Accordingly, the ultimate silicon device is a dual-gate SOI MOSFET with a gate length of 30 nm, an oxide thickness of 3 nm, and a silicon film thickness of 5 to 20 nm. Such a (simulated) device shows no short-channel effects for gate lengths larger than 70 nm and provides transconductance values up to 2300 mS/mm. Typically, short-channel effects in MOSFETs arise from electric-field lines that originate at the drain region and terminate on the channel region. The high-drain bias then induces source-side barrier lowering which, in turn, increases the off-state leakage current of the device. Thus, the fully-depleted dual-gate SOI MOSFETs are theoretically the "ultimate MOSFETs" for avoiding punchthrough and short-channel effects in the deep-submicron region, for optimizing the control of the channel region by the gate, for obtaining the best possible subthreshold slope, and for maximizing the drain saturation current.

Nonetheless, the fabrication of a dual-gate or double-gate device is very difficult, and no satisfactory process technique has been found yet. According to the publication "Fully Depleted Dual-Gated Thin-Film SOI P-MOSFETs Fabricated in SOI Islands with an Isolated Buried Polysilicon Back Gate" by J. P. Denton and G. W. Neudeck, IEEE *Electron Device Letters*, 17, p. 509, 1996, dual-gate SOI transistors can be fabricated using epitaxial lateral overgrowth (ELO) or tunnel epitaxy of silicon over an oxidized polysilicon gate. A second gate is then fabricated on top of the device. Another fabrication method disclosed in "Silicon-on-Insulator Gate-All-Around Device" by J. P. Colinge, M. H. Gao, A. Romano, H. Maes, and C. Claeys, Technical Digest of IEDM, p. 595, 1990 makes use of regular "separation by implanted oxygen (SIMOX)" wafers and adopts a process sequence which is similar to that used for regular SOI MOSFET fabrication, with only one additional mask step and a wet-etch step. The device is called the Gate-All-Around (GAA) MOSFET and was first proposed in 1990. However, the problem with these structures is that the two gates are not self-aligned and that they have poor scaling characteristics.

The next best thing to a double-gate SOI MOSFET is a single-gate device with an implanted ground plane under the buried oxide so as to increases the impurity concentration of the implanted ground plane underneath the channel region of the device to be higher than that of the substrate. The implanted ground plane prevents the electric field lines originating at the drain from spreading under the channel region and from acting as a virtual, positively-biased back gate which would create drain-induced barrier lowering (DIBL) and other short-channel effects. On the other hand, the drawback of an implanted ground plane that would extend underneath the entire device is the increase of the parasitic capacitance between the source/drain and the substrate.

SUMMARY OF THE INVENTION

Therefore, it is an object of the present invention to provide a method of fabricating a silicon-on-insulator (SOI) semiconductor device with an implanted ground plane in which the doping concentration within the underlying silicon substrate is increased underneath the channel region but not under the source and drain regions nor underneath the isolation region between devices so that the source-side barrier is shielded from the high drain-bias to suppress the short-channel effects. The increase in doping concentration underneath the channel region prevents the electric field lines from the gate from terminating under the channel region; instead, the electric field lines terminate in the ground plane, thereby suppressing the short-channel effects and the off-state leakage current of the MOSFETs. For a N-channel MOSFET, the implanted ground plane is P+ type such that if a P-type underlying substrate is used, the ground plane is automatically connected to ground potential (the substrate potential).

According to an embodiment of the present invention, a SOI semiconductor device with an implanted ground plane that is self-aligned to be located underneath a channel region of the semiconductor device but not extending to be underneath the source and the drain is fabricated, comprising the steps of:

(a) forming a semiconductor layer on a semiconductor substrate via a first insulation layer;

(b) forming a sacrificial layer on the semiconductor layer;

(c) forming a window in the sacrificial layer corresponding to the location of a gate electrode to be formed;

(d) forming a high-concentration impurity region in said semiconductor substrate, by implanting ions of the same conductivity type as the semiconductor substrate through the window in the sacrificial layer, an impurity concentration of said impurity region being higher than that of said semiconductor substrate;

(e) forming a gate electrode within said window;

(f) removing said sacrificial layer; and (g) forming source and drain regions in said semiconductor layer by implanting doping ions whose conductivity type is opposite to that of the semiconductor substrate, using said gate electrode as a mask.

According to another embodiment of the present invention, a SOI-type CMOS semiconductor device with two spaced-apart implanted ground planes each self-aligned to be underneath a corresponding channel region of the CMOS is fabricated, wherein the CMOS is comprised of two SOI-type MOSFET semiconductor devices of opposite conductivity types formed on a same semiconductor substrate. Since there is a basic inconsistency in forming two MOSFET devices of opposite conductivity types on a same semiconductor substrate, a well region whose conductivity type is opposite to that of the semiconductor substrate is formed in the semiconductor substrate by a deep ionic implantation. For example, a region having boron ions injected thereto becomes a P-well region, and a region having phosphorous ions injected thereto becomes a N-well region. Subsequently, two ground planes of opposite conductivity types are each implanted underneath a corresponding channel region of the CMOS by implanting doping ions of higher impurity concentration into the semiconductor substrate and the well region, respectively. Wherein, doping ions having the same conductivity type as the substrate are implanted into the substrate, and doping ions having the same conductivity type as the well region are implanted into the well region.

Hence, an SOI CMOS semiconductor device with a P+ ground plane underneath the N-channel device and a N+ ground plane underneath the P-channel device is fabricated according to the present invention. If a P-type semiconductor substrate is used, the implanted P+ ground plane is connected to ground and the implanted N+ ground plane is connected to $V_{DD}$ (supply voltage). This necessitates the formation of a N-well underneath the P-channel devices and a well contact. The N-well can be formed by deep phosphorous implantation through the P-channel devices. On the other hand, if a N-type semiconductor substrate is used, the implanted N+ ground plane is connected to ground and the implanted P+ ground plane is connected to $V_{DD}$ (supply voltage). This necessitates the formation of a P-well underneath the N-channel devices. The P-well can be formed by deep boron implantation through the N-channel devices. The layout of the SOI CMOS device according to the present invention resembles that of a bulk CMOS device except for the self-aligned implanted ground planes underneath the corresponding channel regions. Thereby, the implanted ground plane according to the present invention prevents the electric field lines from the gate electrode from terminating under the channel region, which in turn decreases the short channel effects.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE PREFERRED EMBODIMENT

Accordingly, the present invention provides a method of fabricating a SOI MOSFET semiconductor device with an implanted ground plane self-aligned to be underneath a channel region of the device but not extending to be underneath the source and the drain in such a way that the impurity concentration of the implanted ground plane is higher than that of the substrate.

The following embodiment comprises the steps for fabricating a N-channel device with the implanted ground plane according to an embodiment of the present invention, but the same principles are applicable for fabricating a P-channel device, provided that appropriate changes of the doping polarity or conductivity type are applied when implanting a corresponding ground plane.

Figure 1:
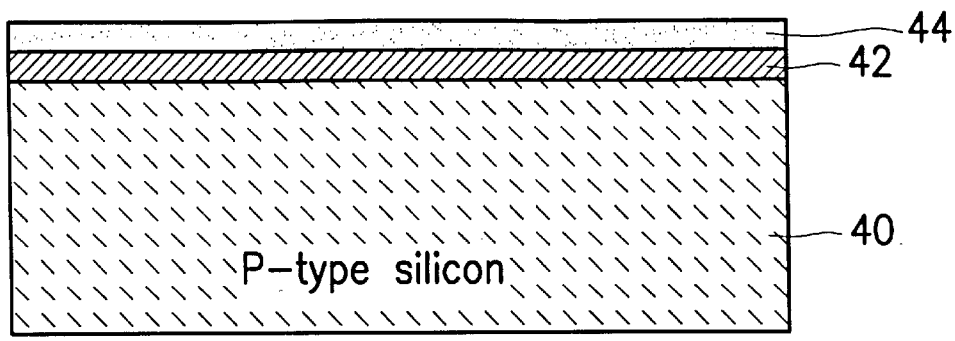
FIG. 1 shows a cross-sectional view of a silicon-on-insulator (SOI) wafer as a starting material for fabricating a SOI semiconductor device with an implanted ground plane according to an embodiment of the present invention.

As shown in FIG. 1, a silicon-on-insulator (SOI) wafer 100 having a P-type SOI layer 44 overlying a first insulating layer 42 on a supporting bulk silicon substrate 40 is provided as a starting material using, but not restricted to, the separation by implanted oxygen (SIMOX) or the SmartCut® technique. Said SOI layer 44 is typically a thin silicon material less than approximately 1000 Å so that the source and drain regions of a semiconductor device are proximate to the underlying first insulating layer 42. Said first insulating layer 42 is typically made of silicon oxide.

Figure 2:
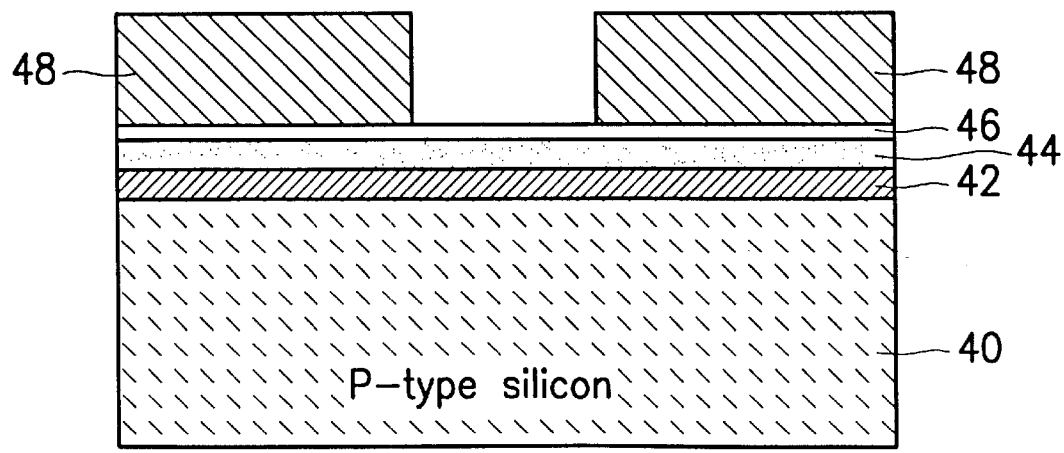
FIG. 2 is a cross-sectional view illustrating the deposition of plural sacrificial layers over the top surface of the SOI wafer of FIG. 1 and the formation of a window in the upper sacrificial layer in accordance with the present invention.

Next, referring to FIG. 2, plural layers of sacrificial materials such as a first sacrificial layer 46 and a second sacrificial layer 48 formed thereon are deposited over the SOI wafer 100, wherein the first sacrificial layer 46 is made of silicon dioxide and the second sacrificial layer 48 is made of silicon nitride. A window 50 corresponding to the position of a pre-determined gate electrode of the semiconductor device is opened through the second sacrificial layer 48 using well-known photolithography and etching techniques.

Figure 3:
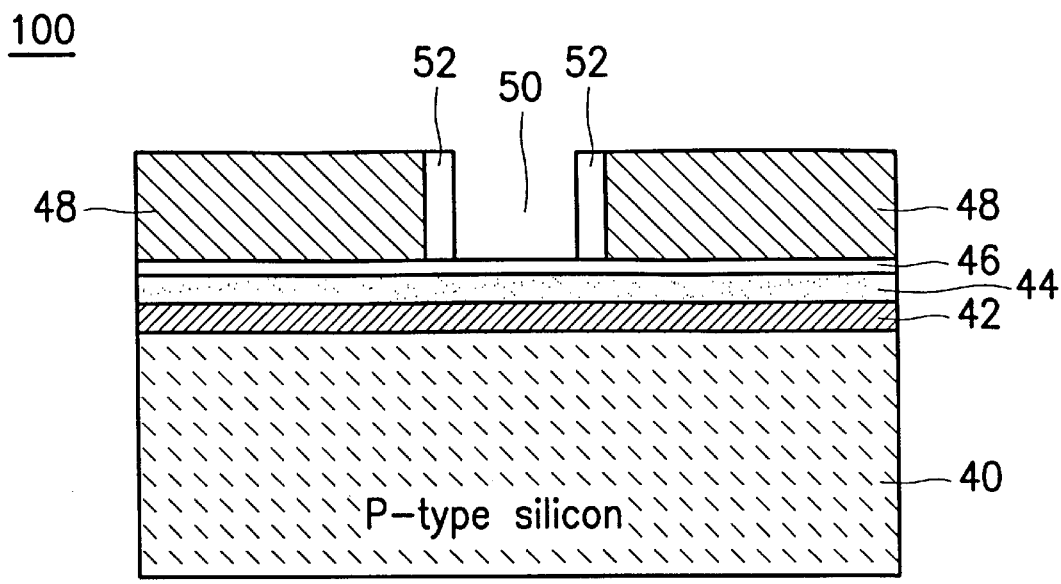
FIG. 3 is a cross-sectional view illustrating the formation of a sidewall spacer within the window of the structure shown in FIG. 2.

Next, referring to FIG. 3, a layer of material such as, but not limited to, silicon dioxide, is deposited and etched back using an anisotropic etching technique such as, but not limited to, reactive ion etching (RIE) in order to form sidewall spacers 52 inside the window 50 in the second sacrificial layer 48. The SOI wafer 100 may comprise other sacrificial layers for etch-stop formation purposes. Then, a planarization technique such as, but not limited to, chemical-mechanical polishing (CMP) or organic material deposition and reactive ion etching (RIE) may be employed to planarize upper surface of the second sacrificial layer 48.

Figure 4:
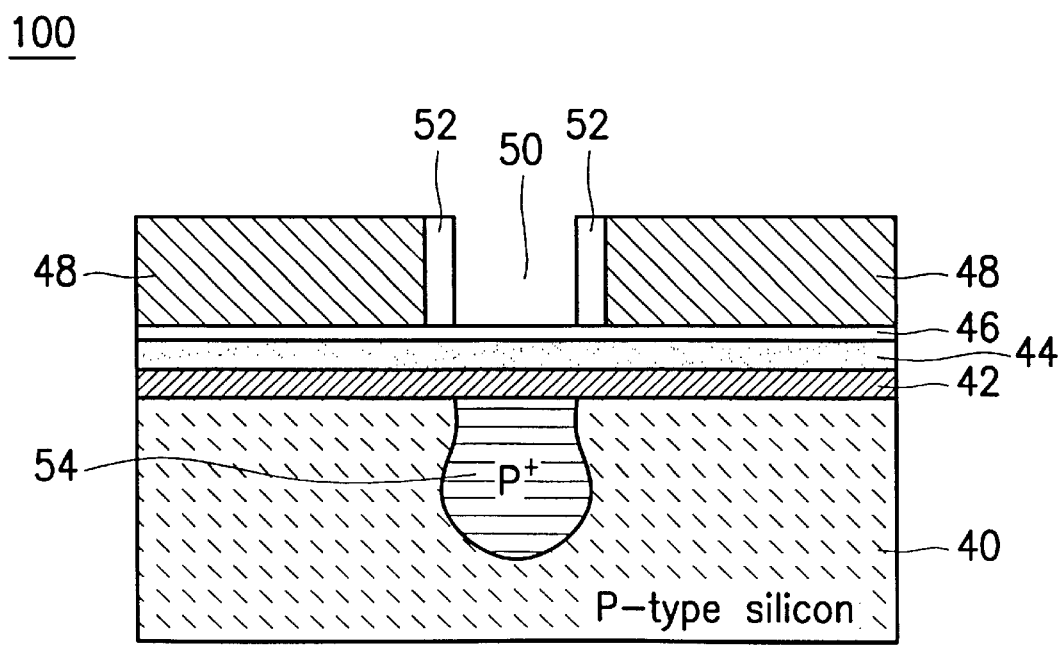
FIG. 4 is a cross-sectional view illustrating the formation of an implanted ground plane in the substrate of the structure shown in FIG. 3 using the sacrificial layer and the window formed therein as a mask.

Next, referring to FIG. 4, doping ions of the same conductivity type as the substrate 40 are injected under said first insulating layer 42 using ion implantation (e.g. boron ions of a higher impurity concentration for a P-type substrate) to form an implanted ground plane 54 such that the second sacrificial layer 48 with the window 50 formed therein is used as a mask during this ion-implanting process. Thus, the implanted ground plane 54 is self-aligned to be situated underneath the pre-determined position of a channel region to be formed since the second sacrificial layer 48 prevents the introduction of the doping ions into regions where no window has been opened in it. In addition, ion implantation can also be used to introduce the doping ions into the SOI layer 44 for threshold voltage adjustment purposes.

Figure 5:
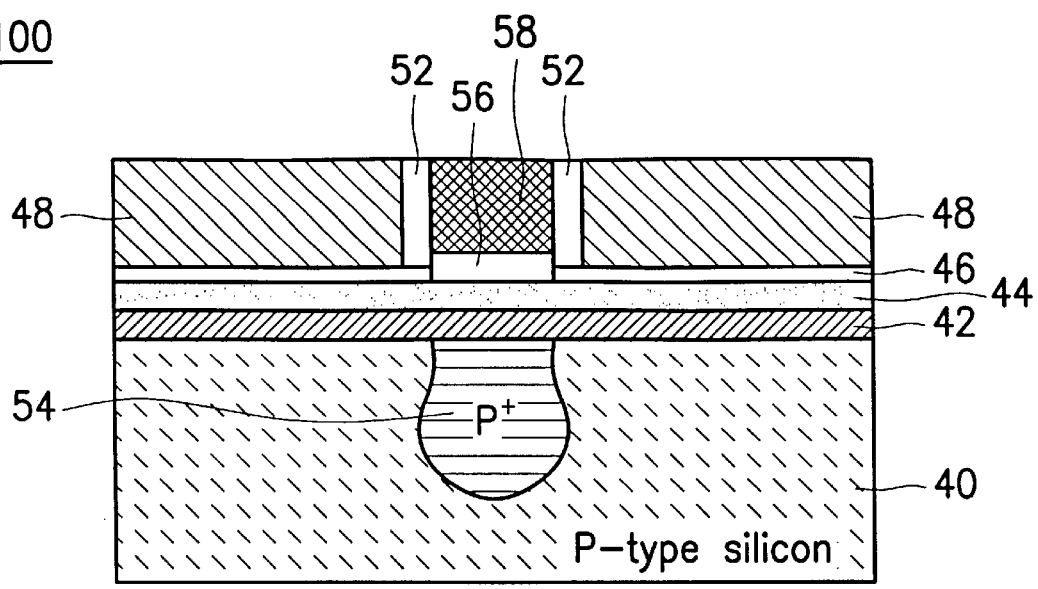
FIG. 5 is a cross-sectional view illustrating the deposition of a gate insulating layer and a gate electrode within the window of the structure shown in FIG. 4.

Next, referring to FIG. 5, the first sacrificial layer 46 within the window 50 is etched away, and a gate insulating layer 56 made of such material as, but not limited to, silicon nitride, silicon oxynitride, or high-K dielectric material is deposited on the SOI layer 44 within the window 50. Furthermore, a gate material such as, but not limited to, polysilicon, is deposited over the gate insulating layer 56 within the window 50 and planarized using a technique such as, but not limited to, chemical-mechanical polishing (CMP) or organic material deposition and RIE etching to form a gate electrode 58 on the gate insulating layer 56.

Figure 6:
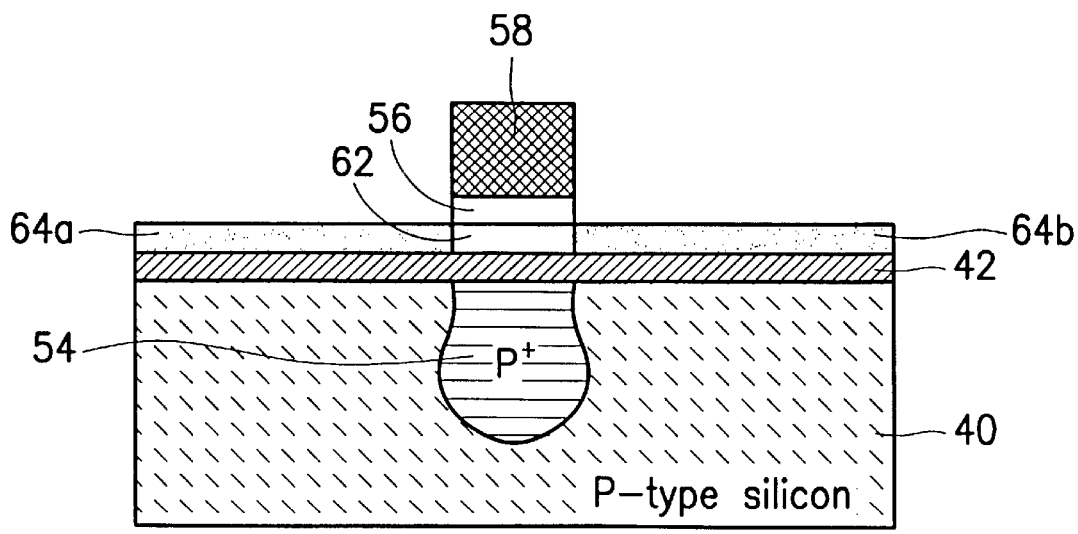
FIG. 6 is a cross-sectional view illustrating the removal of the sacrificial layers and the sidewall spacer form the structure shown in FIG. 5.

Next, referring to FIG. 6, the remaining portions of second sacrificial layer 48 is etched away using appropriate etching techniques. Doping impurity atoms, such as, but not limited to Arsenic, are optionally introduced using a techniques such as, but not limited to, ion implantation to form the so-called source and drain extensions in an area not covered by the gate structure.

Figure 7:
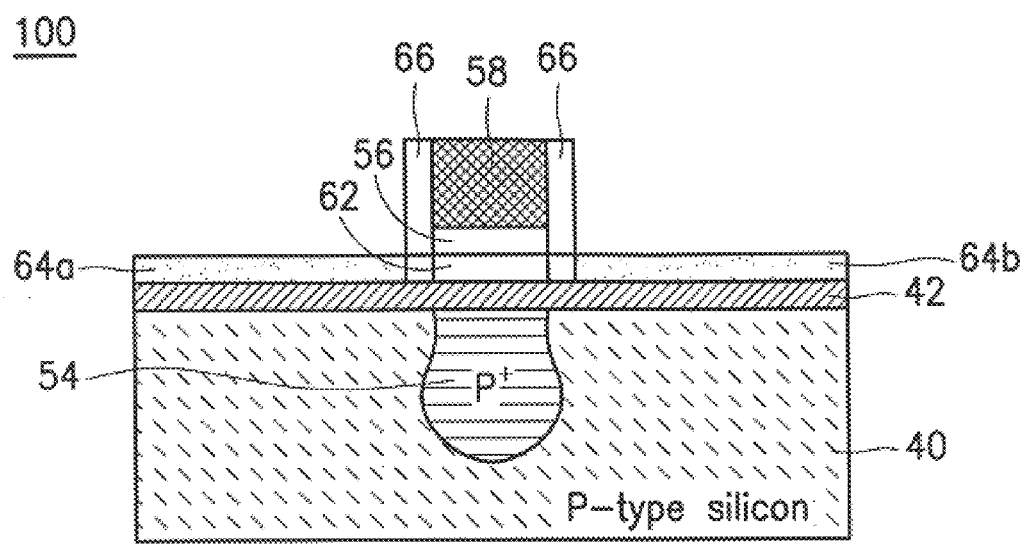
FIG. 7 is a cross-sectional view illustrating the formation of a source, a drain, and a channel region in the SOI layer of the structure shown in FIG. 6, which completes the process of fabricating a SOI semiconductor device with an implanted ground plane according to an embodiment of the present invention.

Subsequently, a dielectric material such as, but not limited to silicon dioxide is deposited and etched anisotropically using a technique such as, but not limited to reactive ion etching (RIE) to produce spacers 66 on the sidewalls of gate electrode 58, as shown in FIG. 7.

Figure 8:
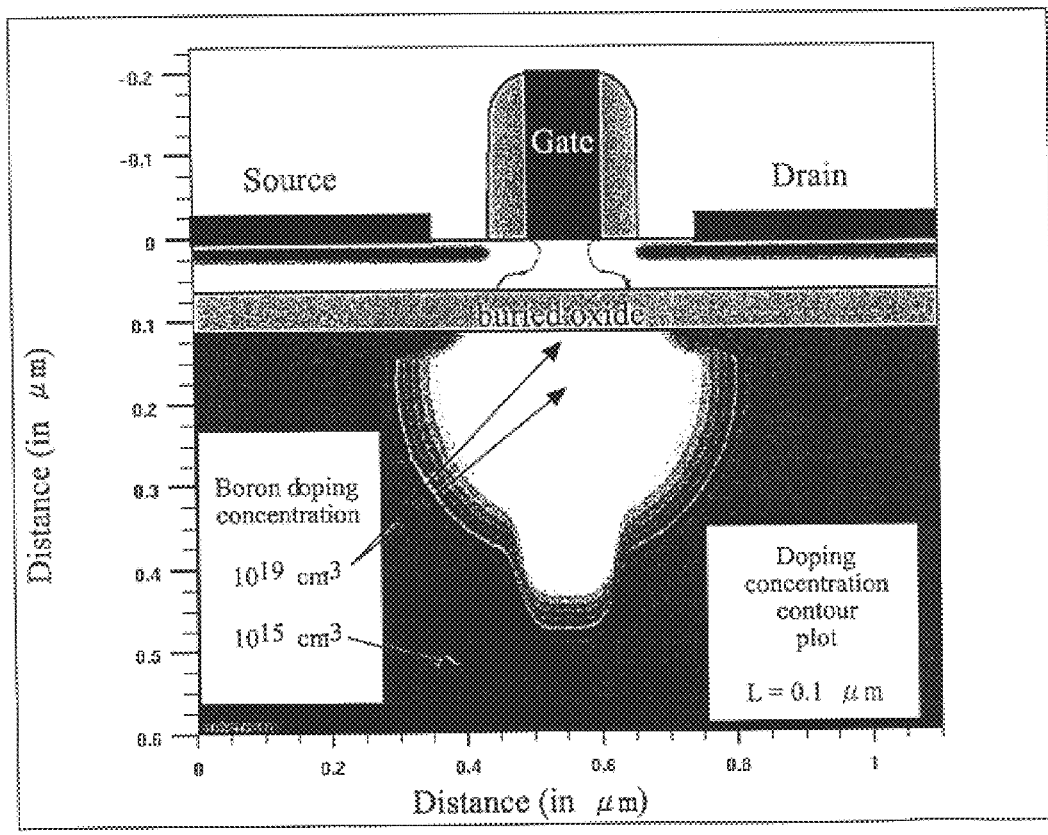
FIG. 8 is a cross-sectional view of a simulated NMOS device illustrating the impurity concentration of the implanted ground plane as a pocket of impurity ions in the silicon substrate underneath the channel region.

Referring to FIG. 7, impurity ions, such as, but not limited to Arsenic, are then introduced into the SOI layer 44 using a technique such as, but not limited to, ion implantation to form the source 64a, the drain 64b, in such a way that the gate electrode 58 is used as a mask. Wherein, the impurity ions that are injected into the SOI layer 44 have a conductivity type opposite to that of the semiconductor substrate 40. FIG. 8 presents the impurity concentration in a simulated NMOS device of the present invention showing the formation of a pocket of doping (impurity) ions in the silicon substrate underneath the channel region.

CMOS Devices

Figure 9:
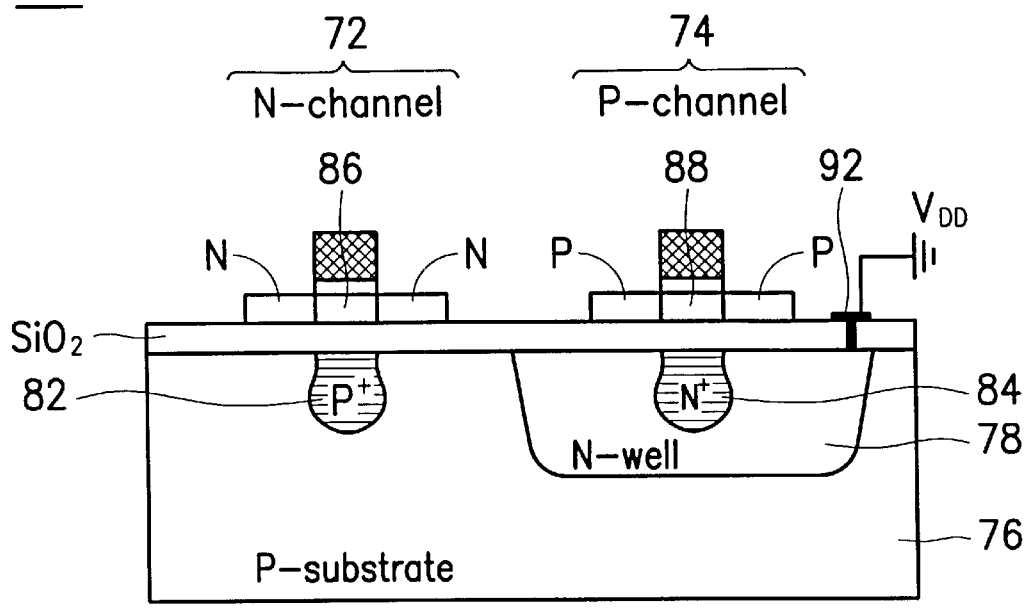
FIG. 9 is a cross-sectional view of a SOI CMOS device with plural implanted ground planes formed on a P-type silicon substrate according to another embodiment of the present invention.

Referring to FIG. 9, a SOI-type CMOS semiconductor device 200 with two spaced-apart implanted ground planes each self-aligned to be underneath a corresponding channel region of the CMOS is fabricated, wherein the CMOS 200 is comprised of two SOI-type MOSFET semiconductor devices of opposite conductivity types, i.e. a N-channel device 72 and a P-channel device 74, formed on a same semiconductor substrate 76 according to another embodiment of the present invention. A well region 78 whose conductivity type is opposite to that of the semiconductor substrate is formed in the semiconductor substrate by a deep ionic implantation. In particular, a region having boron ions injected thereto becomes a P-well region (not shown), and a region having phosphorous ions injected thereto becomes a N-well region. Subsequently, two ground planes of opposite conductivity types, i.e. a P+ ground plane 82 and a N+ ground plane 84, are each implanted underneath a corresponding channel region 86(88) of the CMOS 200 by implanting doping ions of higher impurity concentration into the semiconductor substrate 76 and the well region 78, respectively. Particularly, doping ions having the same conductivity type as the substrate 76 are implanted into the substrate 76, and doping ions having the same conductivity type as the well region 78 are implanted into the well region 78. As shown in FIG. 9, a P+ ground plane 82 is implanted underneath a N-channel device 72 which is formed in the substrate 76, and a N+ ground. plane 84 is implanted underneath a P-channel device 74 which is formed in a N-well region 78 having a well contact 92. Moreover, the implanted P+ ground plane 82 is connected to ground, which is the substrate 76, and the implanted N+ ground plane 84 is connected to a supply voltage $V_{DD}$. The layout of the SOI CMOS according to the present invention resembles that of a bulk CMOS device except for the self aligned implantation in the ground plane.

Figure 10:
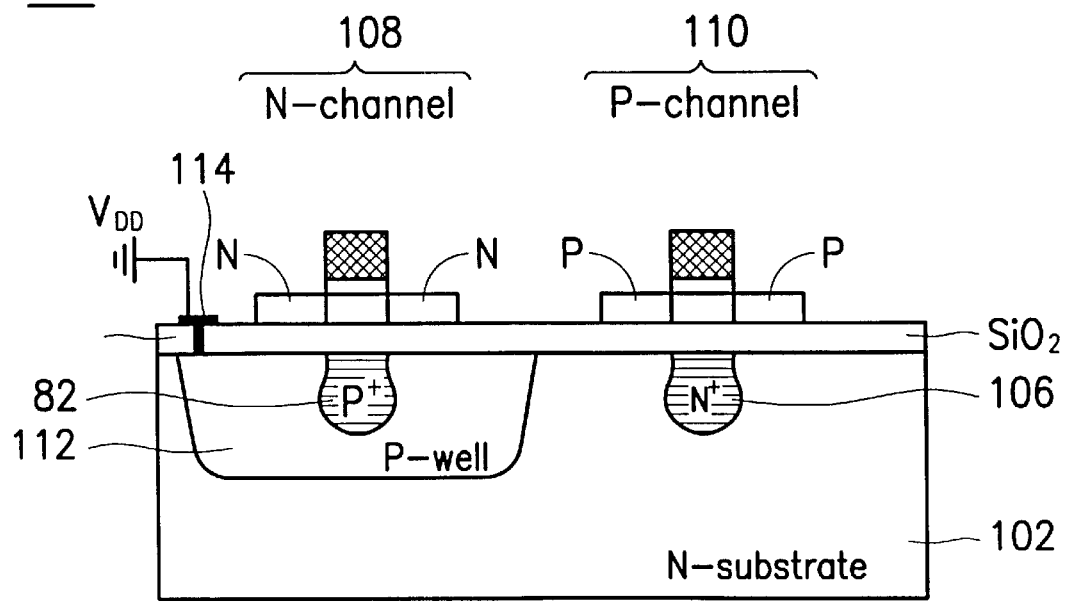
FIG. 10 is a cross-sectional view of a SOI CMOS device with plural implanted ground planes formed on a N-type silicon substrate in accordance with the present invention.

Referring to FIG. 10, it should be noted that the above-mentioned steps are prepared for fabricating a CMOS 200 with implanted ground planes 82 and 84 on a P-type semiconductor substrate 76 as a preferred embodiment of the present invention, but the same principles are applicable for fabricating a CMOS 300 with implanted ground planes on a N-type semiconductor substrate 102, provided that appropriate changes of the doping polarity or conductivity type are applied when implanting corresponding ground planes. Therefore, if a CMOS 300 is fabricated on a N-type semiconductor substrate 102, a N+ ground plane 106 is implanted underneath a P-channel device 110 which is formed in the N-type substrate 102, and a P+ ground plane 104 is implanted underneath a N-channel device 108 which is formed in a P-well region 112 having a well contact 114. Moreover, the implanted N+ ground plane 106 is connected to ground, which is the substrate 102, and the implanted P+ ground plane 104 is connected to a supply voltage $V_{DD}$. The formation of a P-well 112 is achieved by deep boron implantation through the N-channel device 108 of the CMOS 300. The layout of the SOI CMOS device according to the present invention resembles that of a bulk CMOS device except for the self-aligned implanted ground planes underneath the corresponding channel regions.

Thereby, the implanted ground plane according to the present invention prevents the electric field lines from the gate electrode from terminating under the channel region, which in turn decreases the short-channel effects.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method of fabricating a SOI semiconductor device, comprising the steps of:
   (a) forming a semiconductor layer on a semiconductor substrate via a first insulation layer;
   (b) forming a sacrificial layer on the semiconductor layer;
   (c) forming a window in the sacrificial layer corresponding to the location of a gate electrode to be formed;
   (d) forming a high-concentration impurity region in said semiconductor substrate, by implanting ions of the same conductivity type as the semiconductor substrate through the window in the sacrificial layer, an impurity concentration of said impurity region being higher than that of said semiconductor substrate;
   (e) forming a gate electrode within said window;
   (f) removing said sacrificial layer; and
   (g) forming source and drain regions in said semiconductor layer by implanting doping ions whose conductivity type is opposite to that of the semiconductor substrate, using said gate electrode as a mask.

2. The method as claimed in claim 1, wherein said SOI semiconductor device is a N-channel MOSFET device.

3. The method as claimed in claim 1, wherein said SOI semiconductor device is a P-channel MOSFET device.

4. The method as claimed in claim 1, wherein step (c) further comprising the step of:
   forming sidewall spacers on sidewalls of said window.

5. The method as claimed in claim 1, wherein step (g) further comprising the step of:
   forming source and drain extensions by ion implantation.

6. The method as claimed in claim 1, wherein step (g) further comprising the step of:
   forming spacers on sidewalls of the gate electrode.

7. The method as claimed in claim 1, wherein said SOI semiconductor device is a CMOS device having implanted ground planes, said CMOS device comprising a N-channel MOSFET and a P-channel MOSFET formed on a same substrate and a corresponding high-concentration impurity region underneath a channel region of each of the N-channel and P-channel MOSFETs, respectively.

8. The method as claimed in claim 7, wherein said high-concentration impurity region under the channel region of the N-channel MOSFET has a same conductivity type as a P-type substrate and said high-concentration impurity region under the channel region of the P-channel MOSFET has a same conductivity type as a N-well region.

9. The method as claimed in claim 8, wherein said implanted ground planes have impurity concentrations higher than those of the P-type substrate and N-well region, respectively.

10. The method as claimed in claim 7, wherein said implanted ground plane under the channel region of the N-channel MOSFET has a same conductivity type as a P-well region and said implanted ground plane under the channel region of the P-channel MOSFET has a same conductivity type as a N-type substrate.

11. The method as claimed in claim 10, wherein said implanted ground planes have impurity concentrations higher than those of the P-well region and N-type substrate, respectively.

* * * * *